(12) United States Patent
Kosakai et al.

(10) Patent No.: US 11,664,261 B2
(45) Date of Patent: May 30, 2023

(54) ELECTROSTATIC CHUCK DEVICE

(71) Applicant: SUMITOMO OSAKA CEMENT CO., LTD., Tokyo (JP)

(72) Inventors: Mamoru Kosakai, Tokyo (JP); Masaki Ozaki, Tokyo (JP); Keisuke Maeda, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 130 days.

(21) Appl. No.: 16/649,611

(22) PCT Filed: Sep. 12, 2018

(86) PCT No.: PCT/JP2018/033773
§ 371 (c)(1),
(2) Date: Mar. 20, 2020

(87) PCT Pub. No.: WO2019/065233
PCT Pub. Date: Apr. 4, 2019

(65) Prior Publication Data
US 2020/0273736 A1  Aug. 27, 2020

(30) Foreign Application Priority Data

Sep. 29, 2017  (JP) .............................. JP2017-189720

(51) Int. Cl.
*H01L 21/683* (2006.01)
*H01J 37/32* (2006.01)
(Continued)

(52) U.S. Cl.
CPC ...... *H01L 21/6833* (2013.01); *H01J 37/3255* (2013.01); *H01J 37/32697* (2013.01);
(Continued)

(58) Field of Classification Search
CPC .......... H01L 21/6833; H01L 21/67103; H01L 21/68714; H01L 21/67109; H01L 21/3065;
(Continued)

(56) References Cited

U.S. PATENT DOCUMENTS

2009/0199967 A1 * 8/2009 Himori ............. H01J 37/32091
156/345.48
2011/0031217 A1 * 2/2011 Himori ............. H01J 37/32165
216/71
(Continued)

FOREIGN PATENT DOCUMENTS

EP    1316110 B1 * 12/2008 ......... H01L 21/6833
JP    2011-035266 A   2/2011
WO   WO-2016080502 A1 * 5/2016 ....... H01L 21/67069

OTHER PUBLICATIONS

International Search Report for PCT/JP2018/033773 (dated Nov. 27, 2018).

*Primary Examiner* — Ram N Kackar
*Assistant Examiner* — Laureen Chan
(74) *Attorney, Agent, or Firm* — Merchant & Gould P.C.

(57) ABSTRACT

An object of the present invention is to reduce non-uniformity of etching in a plane of a wafer. An electrostatic chuck device includes: an electrostatic chuck part having a sample mounting surface on which a sample is mounted and having a first electrode for electrostatic attraction; a cooling base part placed on a side opposite to the sample mounting surface with respect to the electrostatic chuck part to cool the electrostatic chuck part; and an adhesive layer that bonds the electrostatic chuck part and the cooling base part together, in which the cooling base part has a function of a second electrode that is an RF electrode, a third electrode for RF electrode or LC adjustment is provided between the electrostatic chuck part and the cooling base part, and the third
(Continued)

electrode is bonded to the electrostatic chuck part and the cooling base part and insulated from the cooling base part.

18 Claims, 9 Drawing Sheets

(51) Int. Cl.
    *H01L 21/67*         (2006.01)
    *H01L 21/687*       (2006.01)

(52) U.S. Cl.
    CPC .. *H01J 37/32706* (2013.01); *H01J 37/32715* (2013.01); *H01J 37/32724* (2013.01); *H01L 21/67103* (2013.01); *H01L 21/68714* (2013.01)

(58) Field of Classification Search
    CPC ............ H01L 21/6831; H01L 21/67069; H01J 37/32715; H01J 37/3255; H01J 37/32724; H01J 37/32642; H01J 37/32091; H01J 37/32697; H01J 37/32706; H02N 13/00; B23Q 3/15
    See application file for complete search history.

(56) References Cited

U.S. PATENT DOCUMENTS

| | | | |
|---|---|---|---|
| 2013/0154175 A1* | 6/2013 | Todorow | H01J 37/32715 269/315 |
| 2015/0248994 A1* | 9/2015 | Tandou | H01L 21/6831 156/345.52 |
| 2016/0036355 A1* | 2/2016 | Moriya | H01L 21/6831 361/234 |
| 2017/0280509 A1* | 9/2017 | Takebayashi | H01L 21/6833 |
| 2019/0088517 A1* | 3/2019 | Kosakai | H01L 21/6833 |

* cited by examiner

ELECTROSTATIC CHUCK DEVICE

TECHNICAL FIELD

This application is a U.S. National Stage Application under 35 U.S.C. § 371 of International Patent Application No. PCT/JP2018/033773, filed on Sep. 12, 2018, which claims priority to Japanese Patent Application No. 2017-189720 filed on Sep. 29, 2017, the disclosures of all of which are hereby incorporated by reference in their entireties.

BACKGROUND

In the manufacture of semiconductor devices, there is known a plasma etching apparatus that generates plasma in a hermetically sealable processing chamber and processes a substrate to be processed, such as a semiconductor wafer. In the plasma etching apparatus, uniformity of an etching rate and uniformity of an etching direction in a plane of a wafer are required. However, in the plasma etching apparatus, the etching rate and the etching direction can be affected by the intensity of an electric field and the direction of a line of electric force in the plasma. For this reason, there is a case where the uniformity of the etching rate and the etching direction in the plane of the wafer of the plasma etching apparatus decreases.

In a memory hole or the like of a three-dimensional NAND flash memory, it is necessary to etch a deep hole in multilayer films of an insulating layer and an electrode layer, and thus the etching rate in the plane of the wafer and the perpendicularity of the hole are particularly important.

In the plasma etching apparatus, as a technique for improving a problem of non-uniformity of the etching rate and the etching direction in the plane of the wafer, a plasma processing apparatus in which the uniformity of the etching rate and the etching direction in the plane of the wafer is improved by providing an electrode in a stage on which a substrate is placed and applying high-frequency power to the in-plane of the wafer is known (refer to Patent Literature No. 1).

CITATION LIST

Patent Literature

[Patent Literature No. 1] Japanese Laid-open Patent Publication No. 2011-35266

SUMMARY OF INVENTION

Technical Problem

However, in the plasma processing apparatus described above, even if an acceleration voltage is partially adjusted by a high-frequency voltage applied to a bias distribution control electrode, a high-frequency current moves in an electrostatic chuck electrode, and thus there is a problem in that an in-plane voltage gradient is reduced in the electrostatic chuck electrode and a sufficient effect cannot be exhibited.

Further, it is necessary to install an electrode for electrostatically attracting the wafer and the bias distribution control electrode at an electrostatic chuck part, and as a result, the thickness of the electrostatic chuck part increases, and thus there is a problem in that the high-frequency permeability of the electrostatic chuck part is reduced.

The present invention has been made in view of the above points and provides an electrostatic chuck device in which it is possible to reduce non-uniformity of etching in a plane of a wafer.

Solution to Problem

The present invention has been made to solve the above problems, and according to an aspect of the present invention, there is provided an electrostatic chuck device including: an electrostatic chuck part having a sample mounting surface on which a sample is mounted and having a first electrode for electrostatic attraction; a cooling base part placed on a side opposite to the sample mounting surface with respect to the electrostatic chuck part to cool the electrostatic chuck part; and an adhesive layer that bonds the electrostatic chuck part and the cooling base part together, in which the cooling base part has a function of a second electrode that is an RF electrode, the electrostatic chuck device further includes a third electrode for RF electrode or LC adjustment between the electrostatic chuck part and the cooling base part, and the third electrode is bonded to the electrostatic chuck part and the cooling base part and insulated from the cooling base part.

Further, according to an aspect of the present invention, in the electrostatic chuck device described above, the third electrode is surrounded by an organic insulating material.

Further, according to an aspect of the present invention, in the electrostatic chuck device described above, the third electrode is provided between the sample mounting surface and the cooling base part.

Further, according to an aspect of the present invention, in the electrostatic chuck device described above, the third electrode is bonded to the electrostatic chuck part with an organic material.

Further, according to an aspect of the present invention, in the electrostatic chuck device described above, the third electrode is made of a nonmagnetic material.

Further, according to an aspect of the present invention, in the electrostatic chuck device described above, the third electrode is a metal foil having a thickness of 5 µm or more and 500 µm or less.

Further, according to an aspect of the present invention, in the electrostatic chuck device described above, a fourth electrode for RF electrode or LC adjustment is provided between the electrostatic chuck part and the cooling base part, and the fourth electrode is bonded to the electrostatic chuck part and the cooling base part and insulated from the cooling base part.

Further, according to an aspect of the present invention, in the electrostatic chuck device described above, the fourth electrode is surrounded by an organic insulating material.

Further, according to an aspect of the present invention, in the electrostatic chuck device described above, a structure mounting surface on which an annular structure surrounding a periphery of the sample mounting surface is mounted is provided in a recess around the sample mounting surface and the recess is recessed from the sample mounting surface, and the fourth electrode is provided between the structure mounting surface and the cooling base part.

Further, according to an aspect of the present invention, in the electrostatic chuck device described above, the fourth electrode is bonded to the electrostatic chuck part with an organic material.

Further, according to an aspect of the present invention, in the electrostatic chuck device described above, the fourth electrode is made of a nonmagnetic material.

Further, according to an aspect of the present invention, in the electrostatic chuck device described above, the fourth electrode is a metal foil having a thickness of 5 μm or more and 500 μm or less.

Further, according to an aspect of the present invention, in the electrostatic chuck device described above, the total number of the third electrode and the fourth electrode is one or more.

Further, according to an aspect of the present invention, in the electrostatic chuck device described above, the third electrode and the fourth electrode are insulated from each other with an insulating organic material.

Further, according to an aspect of the present invention, in the electrostatic chuck device described above, a sheet resistance value of the first electrode is larger than $1.0\Omega/\square$ and smaller than $1.0\times10^{10}\Omega/\square$, and a thickness of the first electrode is larger than 0.5 μm and smaller than 50 μm.

Here, the unit of the sheet resistance value is $\Omega/\square$ (ohm per square), and the same applies to the following.

Advantageous Effects of Invention

According to the present invention, it is possible to reduce non-uniformity of etching in a plane of a wafer.

DESCRIPTION OF EMBODIMENTS

First Embodiment

Figure 1:
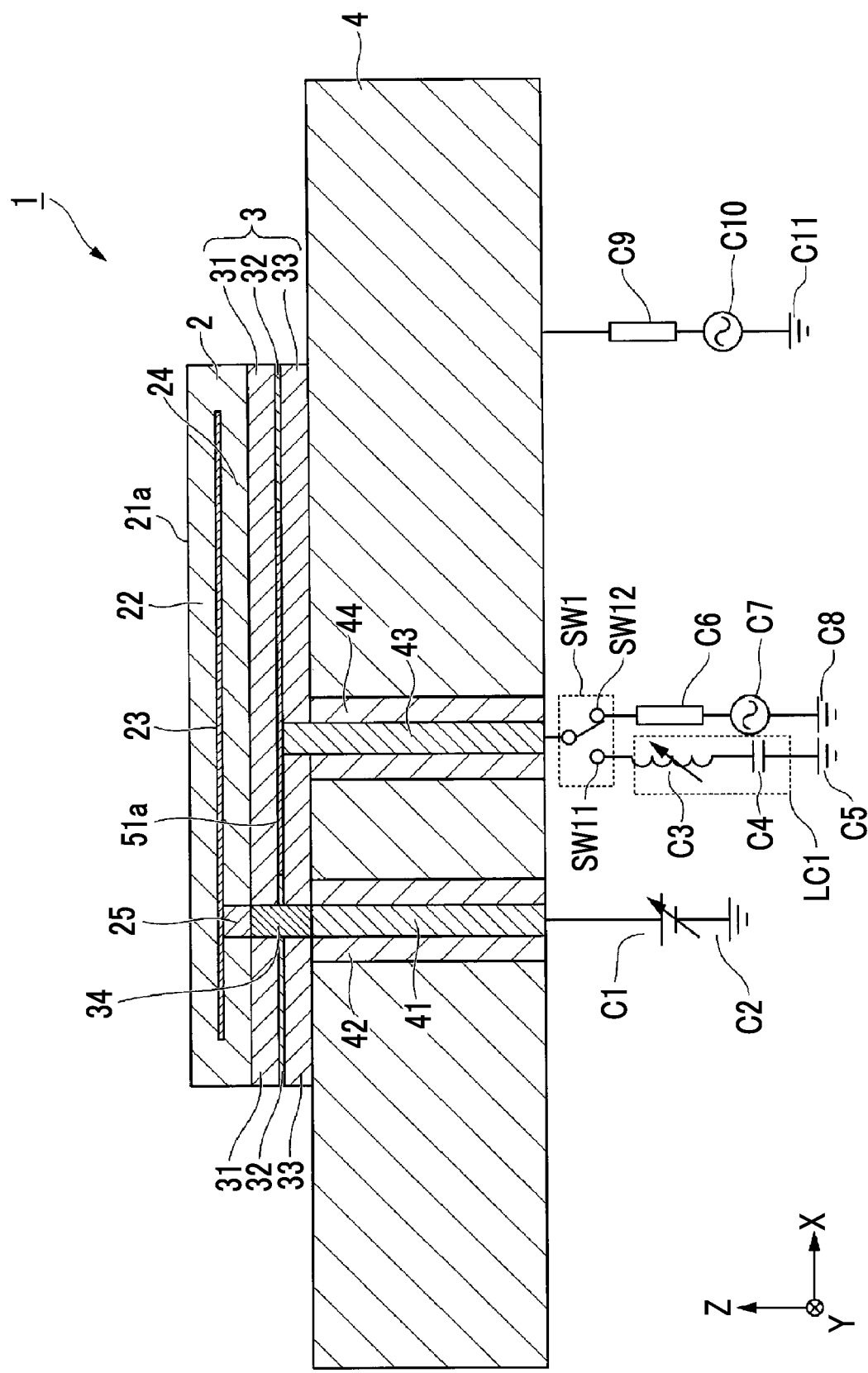
FIG. 1 is a sectional view showing an example of an electrostatic chuck device according to a first embodiment of the present invention.
Figure 2:
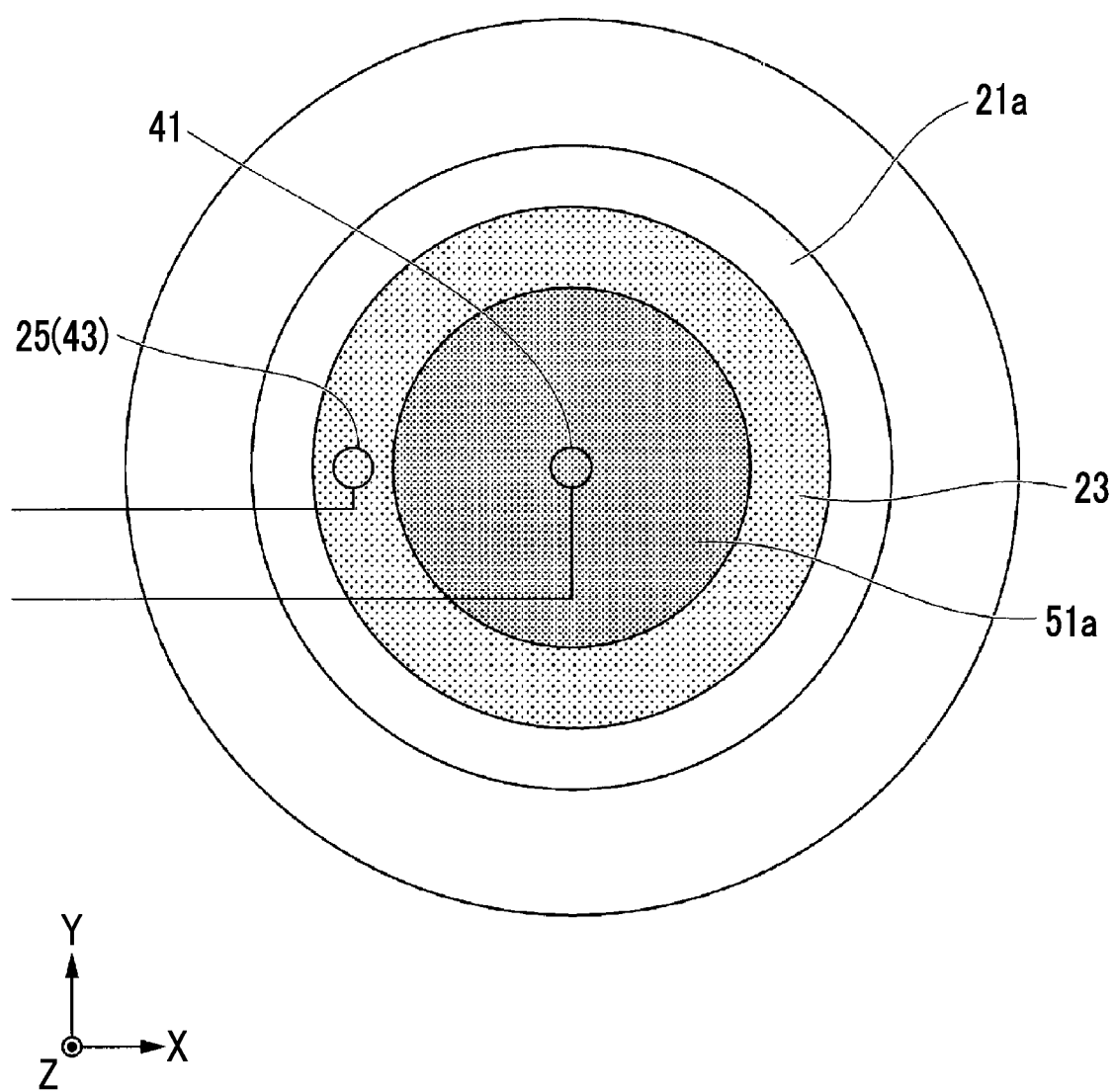
FIG. 2 is a plan view showing an example of an electrode of the electrostatic chuck device according to the first embodiment of the present invention.

Hereinafter, a first embodiment of the present invention will be described in detail with reference to the drawings. FIG. 1 is a sectional view showing an example of an electrostatic chuck device 1 according to this embodiment. FIG. 2 is a plan view showing an example of an electrode of the electrostatic chuck device 1 according to this embodiment. The electrostatic chuck device 1 includes an electrostatic chuck part 2, an insulating adhesive layer 3, and a cooling base part 4. Here, a coordinate system fixed to the electrostatic chuck device 1 is a three-dimensional orthogonal coordinate system X, Y, Z. Here, an X axis of the three-dimensional orthogonal coordinate system X, Y, Z is a direction parallel to the horizontal direction, and a Z axis is an upward direction in the vertical direction. The upward direction is a positive direction of the Z axis.

Each of the electrostatic chuck part 2, the insulating adhesive layer 3, and the cooling base part 4 has a columnar shape. The electrostatic chuck part 2 is installed on the cooling base part 4 with the insulating adhesive layer 3 interposed therebetween. The electrostatic chuck part 2, the insulating adhesive layer 3, and the cooling base part 4 are bonded together such that the centers of the circles of bottom surfaces overlap when the electrostatic chuck device 1 is viewed downward from above.

(Electrostatic Chuck Part)

The electrostatic chuck part 2 has a disk shape, as shown in FIG. 2, when the electrostatic chuck device 1 is viewed downward from above. The electrostatic chuck part 2 includes a placing plate 22, an electrode for wafer electrostatic attraction 23, and a supporting plate 24. The placing plate 22 and the supporting plate 24 are integrated.

The placing plate 22 has a sample mounting surface 21a which is an upper surface of a disk shape.

The sample mounting surface 21a is a surface in which a plate-shaped sample such as a semiconductor wafer is mounted on the upper surface thereof. A plurality of protrusion portions (not shown) each having a diameter smaller than the thickness of the plate-shaped sample are formed at predetermined intervals on the sample mounting surface 21a, and these protrusion portions support the plate-shaped sample.

The supporting plate 24 is in contact with the insulating adhesive layer 3 on the lower surface thereof. Here, the downward direction is a negative direction of the Z axis.

The thickness of the electrostatic chuck part 2 is formed to be 0.7 mm or more and 5.0 mm or less, as an example. For example, if the thickness of the electrostatic chuck part 2 is less than 0.7 mm, it becomes difficult to secure the mechanical strength of the electrostatic chuck part 2. If the thickness of the electrostatic chuck part 2 exceeds 5.0 mm, the heat capacity of the electrostatic chuck part 2 increases, and the thermal responsiveness of the plate-shaped sample mounted thereon deteriorates. The thickness of each part described here is an example and is not limited to the range described above.

The placing plate 22 and the supporting plate 24 have disk shapes in which the shapes of the overlapping surfaces are the same, and are made of an insulating ceramics sintered body having mechanical strength and durability against corrosive gas and plasma thereof, such as an aluminum oxide-silicon carbide ($Al_2O_3$—SiC) composite sintered body, an aluminum oxide ($Al_2O_3$) sintered body, an aluminum nitride (AlN) sintered body, or an yttrium oxide ($Y_2O_3$) sintered body.

The electrode for wafer electrostatic attraction 23 is provided between the placing plate 22 and the supporting plate 24 at an inner peripheral portion of the disk of the electrostatic chuck part 2. The electrode for wafer electrostatic attraction 23 is a disk-shaped electrode, as shown in FIG. 2.

The electrode for wafer electrostatic attraction 23 is used as an electrostatic chuck electrode for generating electric charges and fixing the plate-shaped sample with an electrostatic attraction force, and the shape or size thereof is appropriately adjusted according to the use thereof. The electrode for wafer electrostatic attraction 23 is supported by an electrode pin for wafer electrostatic attraction 25. The electrode pin for wafer electrostatic attraction 25 is provided at an outer peripheral portion of the disk of the electrostatic chuck part 2. The electrode for wafer electrostatic attraction 23 is connected to an extraction electrode terminal 41 (described later) through the electrode pin for wafer electrostatic attraction 25. In FIG. 1, the case where the electrode for wafer electrostatic attraction 23 has a single monopolar structure has been described. However, the electrode for wafer electrostatic attraction 23 may have a plurality of bipolar structures. The case where the electrode for wafer electrostatic attraction 23 has a plurality of bipolar structures will be described later with reference to FIG. 3.

The electrode for wafer electrostatic attraction 23 is preferably formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The electrode pin for wafer electrostatic attraction 25 is formed of, for example, power transmitting ceramic or the like, which is the same material as the electrode for wafer electrostatic attraction 23.

In a plasma etching apparatus, an etching rate and an etching direction are affected by the density of a plasma-excited etching gas, the intensity of an electric field, and the direction of a line of electric force on the sample mounting surface 21a of the electrostatic chuck part 2. In a case where the intensity of the electric field and the direction of the line of electric force on the sample mounting surface 21a are non-uniform on the surface, the etching rate and the etching direction can become non-uniform.

In a case where the density of the excited etching gas per unit volume is smaller in an inner peripheral portion than in an outer peripheral portion, the etching rate becomes lower in the inner peripheral portion than in the outer peripheral portion on the sample mounting surface 21a.

In this case, by increasing the sheath voltage of the inner peripheral portion and increasing the acceleration voltage of ions, it is possible to make the etching rate in the plane of the sample mounting surface 21a uniform.

The sheet resistance value of the electrode for wafer electrostatic attraction 23 is larger than $1.0\Omega/\square$ and smaller than $1.0\times10^{10}\Omega/\square$. If the sheet resistance value of the electrode for wafer electrostatic attraction 23 is small, an RF current flows in a lateral direction in the electrode for wafer electrostatic attraction 23, and the interior of the electrode for wafer electrostatic attraction 23 has an equal potential.

In a case where the interior of the electrode for wafer electrostatic attraction 23 has an equal potential, the effects of third and fourth electrodes for RF electrode or LC adjustment (described below) is suppressed.

The third and fourth electrodes are provided to reduce non-uniformity of the etching rate on the sample mounting surface 21a of the electrostatic chuck part 2. However, since the RF current flows in the lateral direction in the electrode for wafer electrostatic attraction 23, there is a case where the effects of the third and fourth electrodes are not sufficiently obtained.

In the electrostatic chuck device 1, by increasing the sheet resistance value of the electrode for wafer electrostatic attraction 23, it is possible to restrain an electric current from flowing in the lateral direction in the electrode for wafer electrostatic attraction 23.

Further, there is a case where the effect of the third electrode for RF electrode or LC adjustment (sample mounting surface adjustment electrode) 51a (described below) is reduced due to the electrode for wafer electrostatic attraction 23. In the electrostatic chuck device 1, by increasing the sheet resistance value of the electrode for wafer electrostatic attraction 23, it is possible to reduce a decrease in the effect of the third electrode for RF electrode or LC adjustment (sample mounting surface adjustment electrode) 51a.

The thickness of the electrode for wafer electrostatic attraction 23 is larger than 0.5 μm and smaller than 50 μm. The electrode for wafer electrostatic attraction 23 having such a thickness can be easily formed by a film forming method such as a sputtering method or a vapor deposition method, or a coating method such as a screen printing method.

If the thickness of the electrode for wafer electrostatic attraction 23 is less than 0.1 μm, it becomes difficult to secure sufficient conductivity. If the thickness of the electrode for wafer electrostatic attraction 23 exceeds 100 μm, due to the difference in coefficient of thermal expansion between the electrode for wafer electrostatic attraction 23 and the placing plate 22 and the difference in coefficient of thermal expansion between the electrode for wafer electrostatic attraction 23 and the supporting plate 24, peeling or cracking easily occurs at the joining interface between the electrode for wafer electrostatic attraction 23 and the placing plate 22 and the joining interface between the electrode for wafer electrostatic attraction 23 and the supporting plate 24.

(Insulating Adhesive Layer)

The insulating adhesive layer 3 attaches the cooling base part 4 to the lower surface of the electrostatic chuck part 2. The insulating adhesive layer 3 includes a first insulating adhesive layer 31, a second insulating adhesive layer 32, and a third insulating adhesive layer 33 in this order from above.

The first insulating adhesive layer 31, the second insulating adhesive layer 32, and the third insulating adhesive layer 33 are formed of an organic insulating material. The first insulating adhesive layer 31, the second insulating adhesive layer 32, and the third insulating adhesive layer 33 may be formed of a single material or may be formed of different materials.

The first insulating adhesive layer 31, the second insulating adhesive layer 32, and the third insulating adhesive layer 33 are preferably formed of a gel-like, sheet-like, or film-like adhesive resin having heat resistance and insulation properties, such as polyimide resin, epoxy resin, or silicone resin.

In a case where the electrostatic chuck part 2 and the cooling base part 4 have a difference in thermal expansion, the insulating adhesive layer 3 is preferably made of a material having rubber elasticity, and may be silicone resin. A thermally conductive filler may be added to the silicone resin.

In a case where the first insulating adhesive layer 31, the second insulating adhesive layer 32, and the third insulating adhesive layer 33 are formed of different materials, the first insulating adhesive layer 31, the second insulating adhesive layer 32, and the third insulating adhesive layer 33 may be formed of a material having rubber elasticity and a material having a high elastic modulus.

In addition to the adhesive layer, a sheet having high withstand voltage, such as polyimide, may be interposed between the third electrode for RF electrode or LC adjustment (sample mounting surface adjustment electrode) 51a and the cooling base part in order to enhance the insulation properties between the third electrode and the cooling base part.

The second insulating adhesive layer 32 has the third electrode for RF electrode or LC adjustment (sample mounting surface adjustment electrode) 51a at the inner peripheral portion of the disk of the insulating adhesive layer 3. The insulating adhesive layer 3 has the third electrode (sample mounting surface adjustment electrode) 51a in the interior thereof. That is, the third electrode (sample mounting surface adjustment electrode) 51a is surrounded by the insulating adhesive layer 3 which is an organic insulating material. Further, the third electrode (sample mounting surface adjustment electrode) 51a is bonded to the electrostatic chuck part 2 by using the insulating adhesive layer 3, which is an organic insulating material, as an adhesive. The third electrode (sample mounting surface adjustment electrode) 51a is insulated from and bonded to the cooling base part 4 by the insulating adhesive layer 3 which is an organic insulating material.

The third electrode (sample mounting surface adjustment electrode) 51a is bonded to the electrostatic chuck part 2 by the second insulating adhesive layer 32 and the first insulating adhesive layer 31 after being bonded and cured in a state where it is bonded to the cooling base part 4 by the third insulating adhesive layer 33.

In that case, the third insulating adhesive layer 33 is an insulating sheet adhesive, and the second insulating adhesive layer 32 and the first insulating adhesive layer 31 are organic adhesives having higher flexibility than the third insulating adhesive layer 33.

The third electrode (sample mounting surface adjustment electrode) 51a may be bonded to the cooling base part 4 by the second insulating adhesive layer 32 and the third insulating adhesive layer 33 after being bonded and cured in a state where it is bonded to the electrostatic chuck part 2 by the first insulating adhesive layer 31.

In that case, the first insulating adhesive layer 31 is an insulating sheet adhesive, and the second insulating adhesive layer 32 and the third insulating adhesive layer 33 are organic adhesives having higher flexibility than the first insulating adhesive layer 31.

In the electrostatic chuck device 1 according to this embodiment, the third electrode (sample mounting surface adjustment electrode) 51a is insulated from and bonded to the cooling base part 4 by the insulating adhesive layer 3 which is an organic insulating material, and therefore, it is possible to reduce the deterioration of durability caused by the difference between the coefficient of thermal expansion of the electrostatic chuck part 2 and the coefficient of thermal expansion of the cooling base part 4.

Further, in the electrostatic chuck device 1, since the third electrode (sample mounting surface adjustment electrode) 51a is surrounded by the insulating adhesive layer 3 which is an organic insulating material, it is possible to suppress an electric discharge from the side surface of the third electrode (sample mounting surface adjustment electrode) 51a.

The third electrode (sample mounting surface adjustment electrode) 51a is a disk-shaped electrode made of a nonmagnetic material. The third electrode (sample mounting surface adjustment electrode) 51a is a metal foil having a thickness of 5 µm or more and 500 µm or less. It is preferable that the third electrode (sample mounting surface adjustment electrode) 51a has a thickness of 10 µm or more and 200 µm or less.

The third electrode (sample mounting surface adjustment electrode) 51a is preferably formed of a nonmagnetic metal material. The third electrode (sample mounting surface adjustment electrode) 51a is preferably made of titanium (Ti), niobium (Nb), or the like having a coefficient of thermal expansion close to that of the electrostatic chuck part 2.

Since a current value at the portion to which the extraction electrode terminal 43 connected to the third electrode (sample mounting surface adjustment electrode) 51a is connected is large, the third electrode (sample mounting surface adjustment electrode) 51a and the extraction electrode terminal 43 are preferably connected to each other by welding, soldering, or the like. The resistance of the connection portion is reduced due to connection by welding, soldering, or the like. Further, the third electrode (sample mounting surface adjustment electrode) 51a and the extraction electrode terminal 43 are preferably formed of the same material.

In the electrostatic chuck device 1 according to this embodiment, since the third electrode (sample mounting surface adjustment electrode) 51a is made of a nonmagnetic material, a loss of the RF current is small in the third electrode (sample mounting surface adjustment electrode) 51a, and thus it is possible to reduce the non-uniformity of an electric potential on the third electrode (sample mounting surface adjustment electrode) 51a.

Further, the third electrode (sample mounting surface adjustment electrode) 51a is a metal foil having a thickness of 5 µm or more and 200 µm or less, so that a loss of RF and heat generation are small in the third electrode (sample mounting surface adjustment electrode) 51a, and thus the effect of reducing the non-uniformity of an electric potential on the third electrode (sample mounting surface adjustment electrode) 51a is exhibited.

The first insulating adhesive layer 31, the second insulating adhesive layer 32, and the third insulating adhesive layer 33 have a conductive adhesive layer 34 so as not overlap the third electrode (sample mounting surface adjustment electrode) 51a at the outer peripheral portion of the disk of the insulating adhesive layer 3. The first insulating adhesive layer 31, the second insulating adhesive layer 32, and the third insulating adhesive layer 33 are formed to cover the periphery of the conductive adhesive layer 34. The conductive adhesive layer 34 attaches the electrode pin for wafer electrostatic attraction 25 to the extraction electrode terminals 41. The conductive adhesive layer 34 is preferably formed of a silicone-based conductive adhesive having flexibility and electric resistance.

Further, the third insulating adhesive layer 33 has the extraction electrode terminal 43 so as to overlap the third electrode (sample mounting surface adjustment electrode) 51a at the inner peripheral portion of the disk of the insulating adhesive layer 3. The third insulating adhesive layer 33 is formed to cover the periphery of the extraction electrode terminal 43.

(Cooling Base Part)

The cooling base part 4 is for adjusting the temperature of the electrostatic chuck part 2 to a desired temperature and has a thick disk shape. As the cooling base part 4, for example, a water-cooled base or the like, in which a flow path for circulating water is formed, is preferable.

The cooling base part 4 is connected to a high-frequency power source C10 through a matching box C9 which includes a capacitor and a coil. The high-frequency power source C10 applies an RF (radio frequency) voltage for a bias voltage to the cooling base part 4.

That is, the cooling base part 4 has a function as an RF electrode. The high-frequency power source C10 is grounded by an earth C11.

As the material for forming the cooling base part 4, as long as it is metal having excellent thermal conductivity, electrical conductivity, and workability, or a composite material containing such metal, there is no particular limitation, and for example, aluminum (Al), an aluminum alloy, copper (Cu), a copper alloy, stainless steel (SUS), titanium (Ti), or the like is preferably used.

It is preferable that at least the surface of the cooling base part 4, which is exposed to plasma, is subjected to alumite treatment or has an insulating film such as alumina formed thereon.

The cooling base part 4 has the extraction electrode terminal 41 and the extraction electrode terminal 43. The cooling base part 4 is formed to cover the peripheries of the extraction electrode terminal 41 and the extraction electrode terminal 43. The extraction electrode terminal 41 and the extraction electrode terminal 43 are respectively covered with an insulator 42 and an insulator 44 each having insulation properties. The extraction electrode terminal 41 and the extraction electrode terminal 43 are provided so as to penetrate the cooling base part 4 in the Z-axis direction.

The extraction electrode terminal 41 is insulated with respect to the cooling base part 4 made of metal by the insulator 42. The extraction electrode terminal 43 is insulated with respect to the cooling base part 4 made of metal by the insulator 44.

As the materials of the extraction electrode terminal 41 and the extraction electrode terminal 43, as long as it is a nonmagnetic material having excellent heat resistance and conductivity, there is no particular limitation. The material of the extraction electrode terminal 41 preferably has a coefficient of thermal expansion close to the coefficients of thermal expansion of the electrode for wafer electrostatic attraction 23 and the supporting plate 24.

The material of the extraction electrode terminal 43 preferably has a coefficient of thermal expansion close to the coefficients of thermal expansion of the third electrode (sample mounting surface adjustment electrode) 51a and the insulating adhesive layer 3. The extraction electrode terminal 41 and the extraction electrode terminal 43 are made of, for example, a metal material such as titanium (Ti).

In the extraction electrode terminal 43, the current value at the portion to which the extraction electrode terminal 43 connected to the third electrode (sample mounting surface adjustment electrode) 51a is connected is large, and therefore, it is preferable that the extraction electrode terminal 43 is formed of the same material as the third electrode (sample mounting surface adjustment electrode) 51a and is joined thereto by welding or the like.

The extraction electrode terminal 43 is a rod-shaped electrode provided for applying an RF voltage to the third electrode (sample mounting surface adjustment electrode) 51a. The extraction electrode terminal 43 is directly connected to the third electrode (sample mounting surface adjustment electrode) 51a. The extraction electrode terminal 41 is connected to a variable direct-current power source C1 through a high-frequency cutoff filter (not shown). The variable direct-current power source C1 is grounded by an earth C2.

The extraction electrode terminal 43 is connected to a control terminal of a switch SW1. In a case where the switch SW1 is connected to a first terminal SW11, the extraction electrode terminal 43 is connected to an LC resonance circuit LC1. The extraction electrode terminal 43 is grounded by an earth C5 through the LC resonance circuit LC1.

The LC resonance circuit LC1 includes a variable inductor C3 and a capacitor C4. The variable inductor C3 and the capacitor C4 are connected in series. In a case where the switch SW1 is connected to the first terminal SW11, the extraction electrode terminal 43 is connected to the variable inductor C3.

In a case where the switch SW1 is connected to a second terminal SW12, the extraction electrode terminal 43 is connected to a high-frequency power source C7 through a matching box C6. The extraction electrode terminal 43 is grounded by an earth C8 through the matching box C6 and the high-frequency power source C7.

A control circuit (not shown) switches whether the switch SW1 is connected to the first terminal SW11 or the second terminal SW12.

In a case where the switch SW1 is connected to the first terminal SW11, the control circuit (not shown) variably controls the magnitude of the voltage of the third electrode (sample mounting surface adjustment electrode) 51a by adjusting an L component of the LC resonance circuit LC1.

Since the RF voltage applied to the cooling base part 4 flows through the variable inductor C3 and the capacitor C4, the electrostatic chuck device 1 can reduce the sheath voltage of the sample mounting surface 21a which overlaps the third electrode (sample mounting surface adjustment electrode) 51a when the cooling base part 4 is viewed downward from above.

Since the RF voltage of the portion which overlaps the third electrode (sample mounting surface adjustment electrode) 51a when the cooling base part 4 is viewed downward from above is reduced, the sheath voltage of the sample mounting surface 21a at the portion which overlaps the third electrode (sample mounting surface adjustment electrode) 51a when the electrostatic chuck part 2 is viewed downward from above in the sample mounting surface 21a is reduced, and thus it is possible to reduce the non-uniformity of the etching rate and the etching direction on the sample mounting surface 21a.

There is a case where the effect of the third electrode (sample mounting surface adjustment electrode) 51a, which reduces the non-uniformity of the etching rate and the etching direction on the sample mounting surface 21a, is reduced due to the electrode for wafer electrostatic attraction. However, in the electrostatic chuck device 1, by increasing the sheet resistance value of the electrode for wafer electrostatic attraction 23, it is possible to reduce a decrease in the effect of the third electrode (sample mounting surface adjustment electrode) 51a.

In a case where the switch SW1 is connected to the second terminal SW12, the control circuit (not shown) variably controls the magnitude of the voltage of the high-frequency power source C7.

In the electrostatic chuck device 1, the control circuit variably controls the magnitude of the voltage of the high-frequency power source C7 and the phase of the high-frequency power source C10, whereby the RF voltage at the portion overlapping the third electrode (sample mounting surface adjustment electrode) 51a is adjusted, and thus it is possible to control the sheath voltage of the sample mounting surface 21a at the portion overlapping the third electrode (sample mounting surface adjustment electrode) 51a.

The matching box C6 includes a capacitor and a coil. The matching box C6 is an impedance matching device, and matches the impedance between the high-frequency power source C7 on the input side and the third electrode (sample mounting surface adjustment electrode) 51a on the output side.

In this embodiment, the case where the high-frequency power source C7 and the LC resonance circuit LC1 are provided in the electrostatic chuck device 1 has been described. However, the electrostatic chuck device 1 may not be provided with the LC resonance circuit LC1. In that case, the extraction electrode terminal 43 is connected to the matching box C6 without the switch SW1 intervention.

In a case where the third electrode (sample mounting surface adjustment electrode) is provided in the interior of the electrostatic chuck part 2, the structure of the electrostatic chuck part 2 becomes complicated, and the thickness of the electrostatic chuck part 2 can be increased. If the thickness of the electrostatic chuck part 2 is increased, there is a problem in that the permeability of the RF current decreases and the sheath voltage also decreases.

In the electrostatic chuck device 1 according to this embodiment, the third electrode (sample mounting surface adjustment electrode) 51a is provided in the insulating adhesive layer 3 between the cooling base part 4 which is an RF electrode and the electrostatic chuck part 2.

In the electrostatic chuck device 1, the third electrode (sample mounting surface adjustment electrode) 51a is provided in the insulating adhesive layer 3 between the cooling base part 4 which is an RF electrode and the electrostatic chuck part 2, whereby the thickness of the electrostatic chuck part 2 can be reduced compared to a case where the third electrode (sample mounting surface adjustment electrode) is provided in the interior of the electrostatic chuck part 2. Further, in the electrostatic chuck device 1, since the thickness of the electrostatic chuck part 2 can be reduced, the permeability in the electrostatic chuck part 2 of the RF voltage applied to the cooling base part 4 is excellent.

Further, in the electrostatic chuck device 1, the third electrode (sample mounting surface adjustment electrode) 51a is provided in the insulating adhesive layer 3 between the cooling base part 4 which is an RF electrode and the electrostatic chuck part 2, whereby the structure of the electrostatic chuck part 2 is simplified compared to a case where the third electrode (sample mounting surface adjustment electrode) is provided in the interior of the electrostatic chuck part 2, and thus it is possible to easily install the electrostatic chuck part 2 in an electrostatic chuck device known in the related art.

In this embodiment, as an example, the case where a single third electrode (sample mounting surface adjustment electrode) 51a is provided in the interior of the insulating adhesive layer 3 has been described. However, a plurality of third electrodes (sample mounting surface adjustment electrodes) may be provided in the interior of the insulating adhesive layer 3. In a case where the plurality of third electrodes (sample mounting surface adjustment electrodes) are provided in the interior of the insulating adhesive layer 3, the plurality of third electrodes (sample mounting surface adjustment electrodes) are provided such that the plurality of third electrodes (sample mounting surface adjustment electrodes) do not overlap each other in a case where the insulating adhesive layer 3 is viewed downward from above. The shapes of the plurality of third electrodes (sample mounting surface adjustment electrodes) are a disk shape or a ring shape and may be a combination of the disk shapes or the ring shapes.

SUMMARY

As described above, the electrostatic chuck device 1 according to this embodiment includes the electrostatic chuck part 2, the cooling base part 4, and an adhesive layer (the insulating adhesive layer 3).

The electrostatic chuck part 2 has the sample mounting surface 21a on which a sample is mounted, and has a first electrode for electrostatic attraction (the electrode for wafer electrostatic attraction 23).

The cooling base part 4 is placed on the side opposite to the sample mounting surface 21a with respect to the electrostatic chuck part 2 to cool the electrostatic chuck part 2. The cooling base part 4 has the function of a second electrode which is an RF electrode.

The adhesive layer (the insulating adhesive layer 3) bonds the electrostatic chuck part 2 and the cooling base part 4 together.

In the electrostatic chuck device 1, the third electrode for an RF electrode or LC adjustment (sample mounting surface adjustment electrode) 51a is provided between the electrostatic chuck part 2 and the cooling base part 4, and the third electrode for an RF electrode or LC adjustment (sample mounting surface adjustment electrode) 51a is bonded to the electrostatic chuck part 2 and the cooling base part 4 and is insulated from the cooling base part 4.

With this configuration, in the electrostatic chuck device 1 according to this embodiment, since the sheath voltage can be reduced by adjusting the RF voltage at the portion where the etching rate is high, it is possible to reduce the non-uniformity of etching on the sample mounting surface of the electrostatic chuck part 2. In this embodiment, the non-uniformity of etching means that the etching rate and the etching direction become non-uniform.

Further, in the electrostatic chuck device 1 according to this embodiment, the third electrode (sample mounting surface adjustment electrode) 51a is provided in the insulating adhesive layer 3 between the cooling base part 4 which is an RF electrode and the electrostatic chuck part 2, whereby the thickness of the electrostatic chuck part 2 can be reduced compared to a case where the third electrode (sample mounting surface adjustment electrode) 51a is provided in the interior of the electrostatic chuck part 2.

Further, in the electrostatic chuck device 1, since the thickness of the electrostatic chuck part 2 can be reduced, the permeability in the electrostatic chuck part 2 of the RF voltage applied to the cooling base part 4 is improved.

Further, in the electrostatic chuck device 1 according to this embodiment, the third electrode (sample mounting surface adjustment electrode) 51a is surrounded by an organic insulating material.

With this configuration, in the electrostatic chuck device 1 according to this embodiment, it is possible to suppress an electric discharge from the side surface of the third electrode (sample mounting surface adjustment electrode) 51a.

Further, in the electrostatic chuck device 1 according to this embodiment, the third electrode (sample mounting surface adjustment electrode) 51a is provided between the sample mounting surface 21a and the cooling base part 4.

With this configuration, in the electrostatic chuck device 1 according to this embodiment, the structure of the electrostatic chuck part 2 is simplified compared to a case where the third electrode (sample mounting surface adjustment electrode) 51a is provided in the interior of the electrostatic chuck part 2, and thus it is possible to easily install the electrostatic chuck part 2 in an electrostatic chuck device known in the related art.

Further, in the electrostatic chuck device 1 according to this embodiment, the third electrode (sample mounting surface adjustment electrode) 51a is bonded to the electrostatic chuck part 2 with an organic material.

With this configuration, in the electrostatic chuck device 1 according to this embodiment, it is possible to reduce the deterioration in durability caused by the difference between the coefficient of thermal expansion of the electrostatic chuck part 2 and the coefficient of thermal expansion of the cooling base part 4.

Further, in the electrostatic chuck device 1 according to this embodiment, the third electrode 51a is made of a nonmagnetic material. With this configuration, in the electrostatic chuck device 1 according to this embodiment, a loss of the RF current can be reduced in the third electrode (sample mounting surface adjustment electrode) 51a.

Further, in the electrostatic chuck device 1 according to this embodiment, the third electrode (sample mounting surface adjustment electrode) 51a is a metal foil having a thickness of 5 µm or more and 500 µm or less.

With this configuration, in the electrostatic chuck device 1 according to this embodiment, a loss of the RF current is small in the third electrode (sample mounting surface adjustment electrode) 51a, and thus it is possible to reduce the non-uniformity of an electric potential on third electrode (sample mounting surface adjustment electrode) 51a.

Further, in the electrostatic chuck device 1 according to this embodiment, the sheet resistance value of the first electrode (the electrode for wafer electrostatic attraction 23) is larger than $1.0\Omega/\square$ and smaller than $1.0\times10^{10}\Omega/\square$, and the thickness of the first electrode (the electrode for wafer electrostatic attraction 23) is larger than 0.5 µm and smaller than 50 µm.

With this configuration, in the electrostatic chuck device 1 according to this embodiment, it is possible to reduce a decrease in the effect of the third electrode (sample mounting surface adjustment electrode) 51a that reduces the non-uniformity of the etching rate and the etching direction on the sample mounting surface 21a. Further, in the electrostatic chuck device 1, sufficient electrical conductivity can be secured, and the robustness of the electrostatic chuck part 2 can be increased.

Modification Example of First Embodiment

Figure 3:
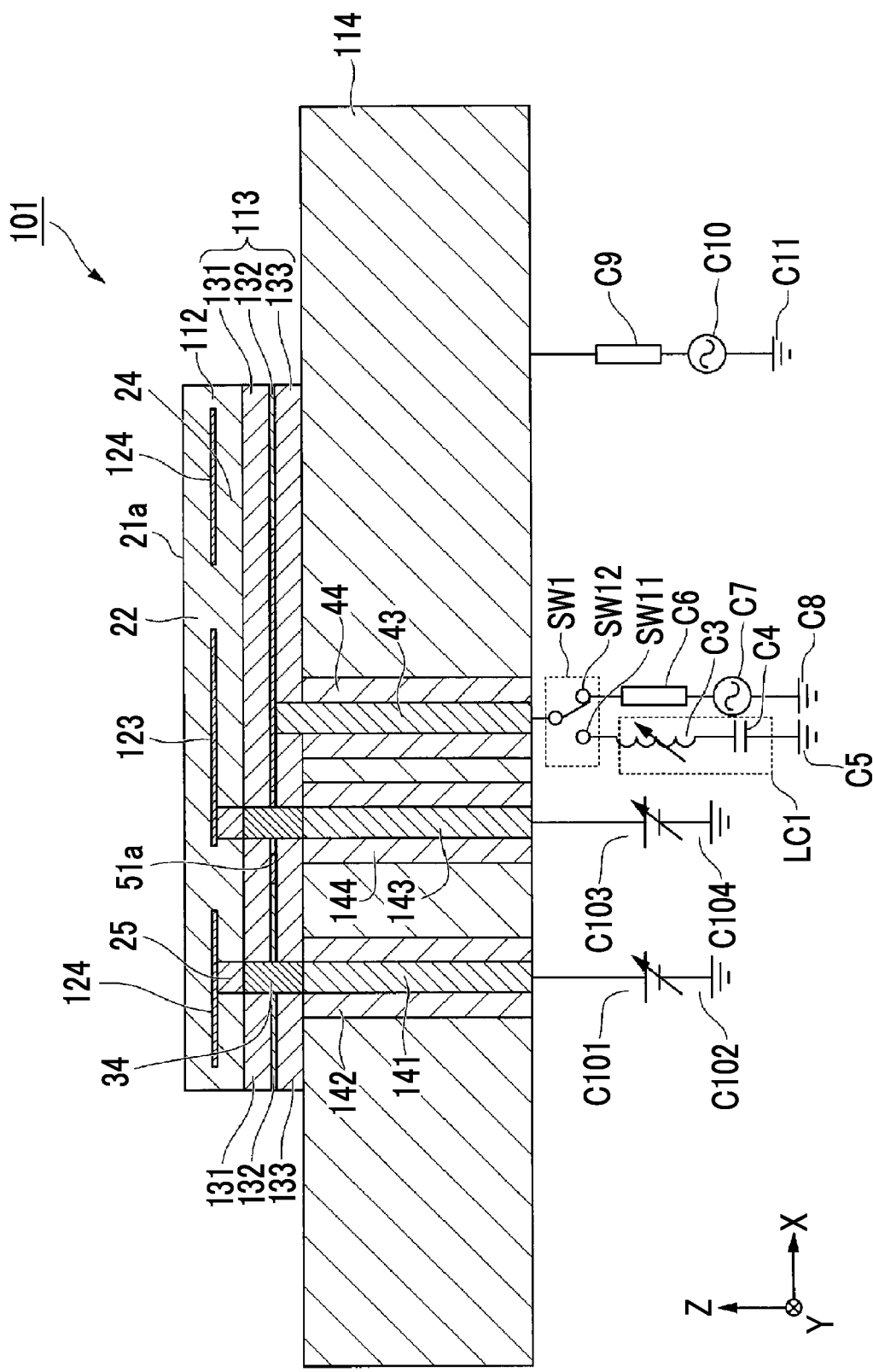
FIG. 3 is a sectional view showing a first modification example of the electrostatic chuck device according to the first embodiment of the present invention.

Here, a case where the electrode for wafer electrostatic attraction 23 has a plurality of bipolar structures will be described with reference to FIG. 3. FIG. 3 is a sectional view showing a first modification example of the electrostatic chuck device according to this embodiment. An electrostatic chuck device 101 includes a first electrode for wafer electrostatic attraction 123 in the interior of an electrostatic chuck part 112.

The first electrode for wafer electrostatic attraction 123 is provided in the interior of the electrostatic chuck part 112 at an inner peripheral portion of the portion which overlaps the sample mounting surface 21a when the electrostatic chuck part 112 is viewed downward from above. A second electrode for wafer electrostatic attraction 124 is provided in the interior of the electrostatic chuck part 112 at an outer peripheral portion of the portion which overlaps the sample mounting surface 21a when the electrostatic chuck part 112 is viewed downward from above.

The first electrode for wafer electrostatic attraction 123 is a disk-shaped electrode. The first electrode for wafer electrostatic attraction 123 is connected to an extraction electrode terminal 143 through an electrode pin for wafer electrostatic attraction. The extraction electrode terminal 143 and an insulator 144 are provided so as not to overlap with the extraction electrode terminal 43 and the insulator 44.

The second electrode for wafer electrostatic attraction 124 is a ring-shaped electrode. The second electrode for wafer electrostatic attraction 124 is connected to an extraction electrode terminal 141 through an electrode pin for wafer electrostatic attraction.

Second Embodiment

Hereinafter, a second embodiment of the present invention will be described in detail with reference to the drawings.

In the first embodiment described above, the case has been described where the electrostatic chuck device has the third electrode for RF electrode or LC adjustment (sample mounting surface adjustment electrode) 51a between the electrostatic chuck part and the cooling base part. In this embodiment, a case will be described where the electrostatic chuck device has an electrode for electrostatic attraction between a structure mounting surface and the cooling base part.

The electrostatic chuck device according to this embodiment is referred to as an electrostatic chuck device 201.

Figure 4:
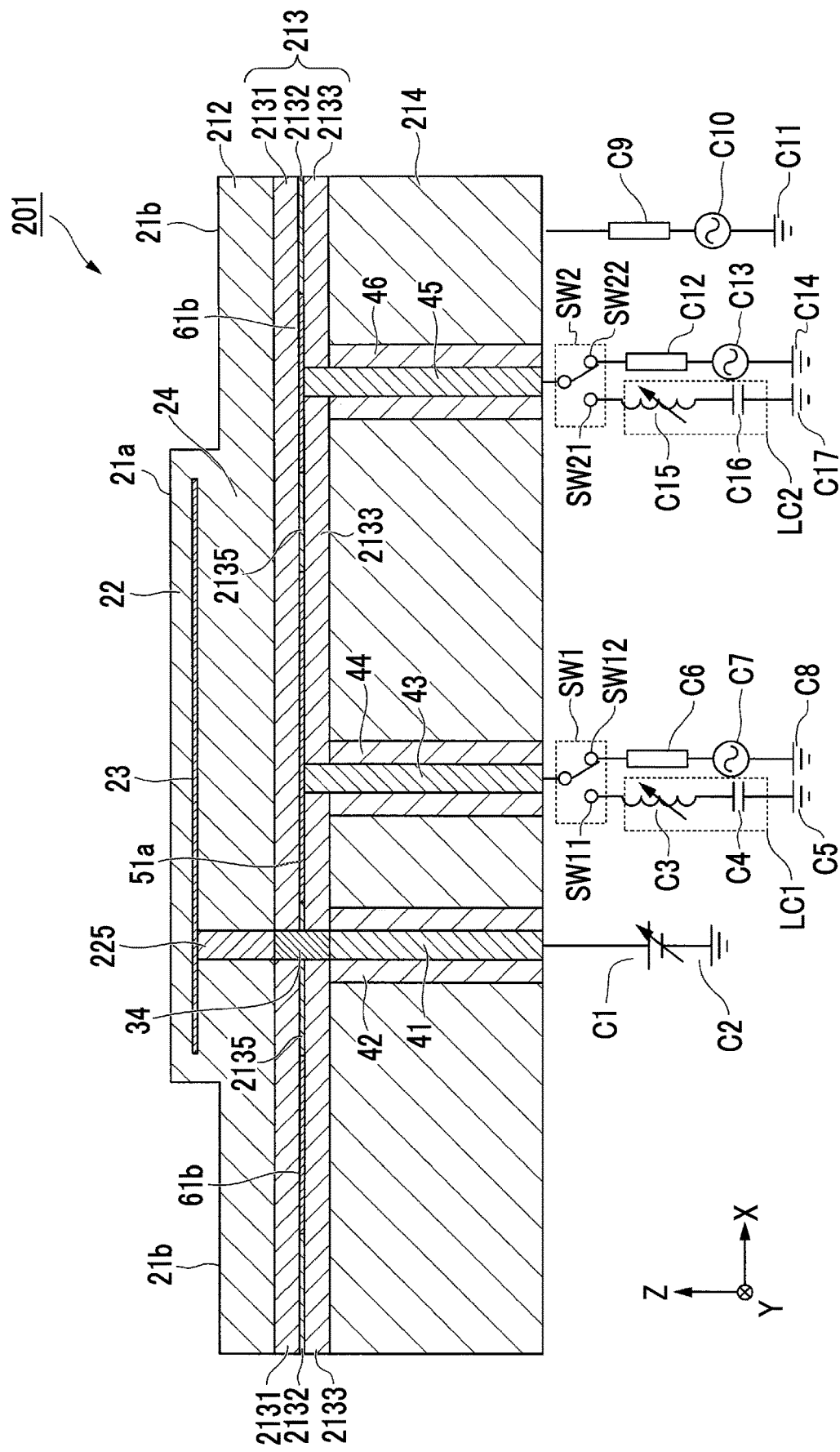
FIG. 4 is a sectional view showing an example of an electrostatic chuck device according to a second embodiment of the present invention.

FIG. 4 is a sectional view showing an example of the electrostatic chuck device 201 according to this embodiment. The electrostatic chuck device 201 includes an electrostatic chuck part 212, an insulating adhesive layer 213, and a cooling base part 214.

If the electrostatic chuck device 201 (FIG. 4) according to this embodiment is compared with the electrostatic chuck device 1 (FIG. 1) according to the first embodiment, the electrostatic chuck device 201 (FIG. 4) according to this embodiment has a structure mounting surface 21b.

Further, the electrostatic chuck device 201 (FIG. 4) according to this embodiment may be provided with a fourth electrode for RF electrode or LC adjustment (FR part surface potential adjustment electrode) 61b in the insulating adhesive layer 213 between the electrostatic chuck part 212 and the cooling base part 214. The fourth electrode (FR part surface potential adjustment electrode) 61b adjust a sheath voltage on the structure mounting surface 21b.

Further, an electrode for structure electrostatic attraction may be provided in the electrostatic chuck part 212 or in the insulating adhesive layer 213 between the electrostatic chuck part 212 and the cooling base part 214. A case where the electrode for structure electrostatic attraction is provided in the electrostatic chuck part 212, and a case where the electrode for structure electrostatic attraction is provided in the insulating adhesive layer 213 will be described later with reference to FIGS. 5 and 6.

Here, the functions of the other components are the same as those in the first embodiment. Description of the same functions as those in the first embodiment will be omitted, and in the second embodiment, description will be made focusing on portions different from those of the first embodiment.

The electrostatic chuck part 212 has the sample mounting surface 21a and the structure mounting surface 21b on the upper surface thereof. The sample mounting surface 21a is an upper surface of an inner peripheral portion of the disk of the electrostatic chuck part 212.

The structure mounting surface 21b is an upper surface of an outer peripheral portion of the disk of the electrostatic chuck part 212. The structure mounting surface 21b is provided in a recess recessed from the sample mounting surface 21a. The structure mounting surface 21b is a surface on which a focus ring is placed. That is, the electrostatic chuck part 212 has the structure mounting surface 21b on which the focus ring which is an annular structure surrounding the periphery of the sample mounting surface 21a is mounted, in the recess which is located around the sample mounting surface 21a and is recessed from the sample mounting surface 21a.

The electrostatic chuck part 212 has the structure mounting surface 21b, so that the electrostatic chuck part 212 is thicker than the electrostatic chuck part 2 (FIG. 1) of the electrostatic chuck device 1 according to the first embodiment by the thickness of the structure mounting surface 21b. An electrode pin for wafer electrostatic attraction 225 is longer than the electrode pin for wafer electrostatic attraction 25 (FIG. 1) of the electrostatic chuck device 1 according to the first embodiment.

The focus ring (not shown) is formed of, for example, a material having the same electrical conductivity as the wafer which is mounted on the sample mounting surface 21a. The focus ring is disposed at the peripheral edge portion of the wafer, whereby the electrical environment with respect to plasma can be made substantially coincident with that of the sample mounting surface 21a, and therefore, it is possible to reduce the non-uniformity of the etching rate between the central portion and the peripheral portion on the sample mounting surface 21a of the electrostatic chuck part 212.

The insulating adhesive layer 213 attaches the cooling base part 214 to the lower surface of the electrostatic chuck part 212. The insulating adhesive layer 213 includes a first insulating adhesive layer 2131, a second insulating adhesive layer 2132, a third insulating adhesive layer 2133, and a fourth insulating adhesive layer 2135. The second insulating adhesive layer 2132 and the fourth insulating adhesive layer 2135 are provided on the third insulating adhesive layer 2133. The first insulating adhesive layer 2131, the second insulating adhesive layer 2132, the third insulating adhesive layer 2133, and the fourth insulating adhesive layer 2135 are formed of an organic insulating material. The first insulating adhesive layer 2131, the second insulating adhesive layer 2132, the third insulating adhesive layer 2133, and the fourth insulating adhesive layer 2135 may be formed of a single material or may be formed of different materials.

The electrostatic chuck part 212 has the structure mounting surface 21b, so that the diameter of the circle of the bottom surface of the insulating adhesive layer 213 having a columnar shape is larger than the diameter of the insulating adhesive layer 3 (FIG. 1) of the electrostatic chuck device 1 according to the first embodiment.

The insulating adhesive layer 213 has the fourth electrode for RF electrode or LC adjustment (FR part surface potential adjustment electrode) 61b in the interior of the outer peripheral portion of the disk of the insulating adhesive layer 213. The third electrode for RF electrode or LC adjustment (sample mounting surface adjustment electrode) 51a, the fourth insulating adhesive layer 2135, the fourth electrode (FR part surface potential adjustment electrode) 61b, and the second insulating adhesive layer 2132 are provided from the inner peripheral portion to the outer peripheral portion in the disk of the insulating adhesive layer 213 in the order of the third electrode for RF electrode or LC adjustment (sample mounting surface adjustment electrode) 51a, the fourth insulating adhesive layer 2135, the fourth electrode (FR part surface potential adjustment electrode) 61b, and the second insulating adhesive layer 2132.

The second insulating adhesive layer 2132 and the fourth insulating adhesive layer 2135 are separated from each other by the fourth electrode (FR part surface potential adjustment electrode) 61b.

The insulating adhesive layer 213 has the fourth electrode (FR part surface potential adjustment electrode) 61b over the portion which overlaps the structure mounting surface 21b when the electrostatic chuck part 212 is viewed downward from above, and the portion which overlaps the sample mounting surface 21a when the electrostatic chuck part 212 is viewed downward from above, and does not overlap the electrode for wafer electrostatic attraction 23.

The fourth electrode (FR part surface potential adjustment electrode) 61b is an electrode for adjusting the sheath voltage of the outer peripheral portion of the wafer and the focus ring part and is directly connected to an extraction electrode terminal 45 (described later).

The electrostatic chuck device 201 has the fourth electrode (FR part surface potential adjustment electrode) 61b between the structure mounting surface 21b and the cooling base part 214.

The cooling base part 214 has the extraction electrode terminal 45 in addition to the extraction electrode terminal 41 and the extraction electrode terminal 43. The cooling base part 214 is formed to cover the periphery of the extraction electrode terminal 45.

The extraction electrode terminal 45 is covered with an insulator 46 having an insulation properties. The insulator 46 is provided so as to penetrate the cooling base part 214 in the Z-axis direction.

The extraction electrode terminal 45 is insulated with respect to the cooling base part 214 made of metal by the insulator 46.

As the material of the extraction electrode terminal 45, as long as it is a conductive material having excellent heat resistance, there is no limitation.

The material of the extraction electrode terminal 45 preferably has a coefficient of thermal expansion close to the coefficients of thermal expansion of the fourth electrode (FR part surface potential adjustment electrode) 61b and the insulating adhesive layer 213. The extraction electrode terminal 45 is made of, for example, a metal material such as titanium (Ti).

The extraction electrode terminal 45 is a rod-shaped electrode provided to apply an RF voltage to the fourth electrode (FR part surface potential adjustment electrode) 61b. The extraction electrode terminal 45 is directly connected to the fourth electrode (FR part surface potential adjustment electrode) 61b. The extraction electrode terminal 45 is connected to a control terminal of a switch SW2.

In a case where the switch SW2 is connected to a first terminal SW21, the extraction electrode terminal 45 is connected to an LC resonance circuit LC2. The extraction electrode terminal 45 is grounded by an earth C17 through the LC resonance circuit LC2. The LC resonance circuit LC2 includes a variable inductor C15 and a capacitor C16. The variable inductor C15 and the capacitor C16 are connected in series.

In a case where the switch SW2 is connected to the first terminal SW21, the extraction electrode terminal 45 is connected to the variable inductor C15.

In a case where the switch SW2 is connected to a second terminal SW22, the extraction electrode terminal 45 is connected to a high-frequency power source C13 through a matching box C12. The extraction electrode terminal 45 is grounded by an earth C14 through the matching box C12 and the high-frequency power source C13.

The control circuit (not shown) switches whether the switch SW2 is connected to the first terminal SW21 or the second terminal SW22.

In a case where the switch SW2 is connected to the first terminal SW21, the control circuit (not shown) variably controls the magnitude of the voltage of the fourth electrode (FR part surface potential adjustment electrode) 61b by adjusting the L component of the LC resonance circuit LC2.

The RF acceleration voltage of the portion which overlaps the fourth electrode (FR part surface potential adjustment electrode) 61b when the cooling base part 214 is viewed downward from above is reduced, and therefore, the sheath voltage above the portion which overlaps the fourth electrode (FR part surface potential adjustment electrode) 61b when the electrostatic chuck part 212 is viewed downward from above in the fourth electrode (FR part surface potential adjustment electrode) 61b is reduced, and thus it is possible to reduce the non-uniformity of the etching rate and the etching direction on the fourth electrode (FR part surface potential adjustment electrode) 61b.

In a case where the switch SW2 is connected to the second terminal SW22, the control circuit (not shown) variably controls the magnitude of the voltage of the high-frequency power source C13.

In the electrostatic chuck device 201, the control circuit variably controls the magnitude of the voltage of the high-frequency power source C13, thereby controlling the acceleration voltage of the cooling base part 4 connected to the high-frequency power source C10.

The matching box C12 includes a capacitor and a coil. The matching box C12 is an impedance matching device and matches the impedance between the high-frequency power source C13 on the input side and the fourth electrode (FR part surface potential adjustment electrode) 61b on the output side.

In this embodiment, the case where the high-frequency power source C13 and the LC resonance circuit LC2 are provided in the electrostatic chuck device 201 has been described. However, the electrostatic chuck device 201 may not be provided with the LC resonance circuit LC2. In that case, the extraction electrode terminal 45 is connected to the matching box C12 without the switch SW2 intervention.

In the electrostatic chuck device 201, the fourth electrode (FR part surface potential adjustment electrode) 61b is provided, and therefore, it is possible to adjust the FR voltage at the portions where the sample mounting surface 21a and the structure mounting surface 21b overlap the fourth electrode (FR part surface potential adjustment electrode) 61b in a case where the electrostatic chuck part 212 is viewed downward from above.

In the electrostatic chuck device 201, it is possible to adjust the intensity of the sheath voltage and the direction of the sheath voltage of the structure mounting surface 21b at the portions where the sample mounting surface 21a and the structure mounting surface 21b overlap the fourth electrode (FR part surface potential adjustment electrode) 61b in a case where the electrostatic chuck part 212 is viewed downward from above.

As described above, in the electrostatic chuck device 201 according to this embodiment, the fourth electrode for RF electrode or LC adjustment (FR part surface potential adjustment electrode) 61b is provided between the electrostatic chuck part 212 and the cooling base part 214, and the fourth electrode (FR part surface potential adjustment electrode) 61b is bonded to the electrostatic chuck part 212 and the cooling base part 214 and is insulated from the cooling base part 214.

With this configuration, in the electrostatic chuck device 201 according to this embodiment, it is possible to adjust the sheath voltage of the structure mounting surface 21b at the portion overlapping the fourth electrode (FR part surface potential adjustment electrode) 61b.

Further, in the electrostatic chuck device 201 according to this embodiment, the fourth electrode (FR part surface potential adjustment electrode) 61b is surrounded by an organic insulating material.

With this configuration, in the electrostatic chuck device 201 according to this embodiment, it is possible to suppress an electric discharge from the side surface of the fourth electrode (FR part surface potential adjustment electrode) 61b.

Further, in the electrostatic chuck device 201 according to this embodiment, the structure mounting surface 21b on which an annular structure surrounding the periphery of the sample mounting surface 21a is mounted is provided in the recess which is located around the sample mounting surface 21a and is recessed from the sample mounting surface 21a, and the fourth electrode (FR part surface potential adjustment electrode) 61b is provided between the structure mounting surface 21b and the cooling base part 214.

With this configuration, in the electrostatic chuck device 201 according to this embodiment, it is possible to adjust the intensity and direction of the sheath voltage on the structure mounting surface 21b of the outer peripheral portion of the electrostatic chuck part 212.

Further, in the electrostatic chuck device 201 according to this embodiment, the fourth electrode (FR part surface potential adjustment electrode) 61b is bonded to the electrostatic chuck part 212 with an organic material.

With this configuration, in the electrostatic chuck device 201 according to this embodiment, it is possible to reduce the deterioration of durability caused by the difference between the coefficient of thermal expansion of the electrostatic chuck part 212 and the coefficient of thermal expansion of the cooling base part 214.

Further, in the electrostatic chuck device 201 according to this embodiment, the fourth electrode (FR part surface potential adjustment electrode) 61b is made of a nonmagnetic material.

With this configuration, in the electrostatic chuck device 201 according to this embodiment, it is possible to reduce a loss of the RF current in the fourth electrode (FR part surface potential adjustment electrode) 61b.

Further, in the electrostatic chuck device 201 according to this embodiment, the fourth electrode (FR part surface potential adjustment electrode) 61b is a metal foil having a thickness of 5 µm or more and 500 µm or less.

With this configuration, in the electrostatic chuck device 201 according to this embodiment, a loss of the RF current is small in the fourth electrode (FR part surface potential adjustment electrode) 61b, and thus it is possible to reduce the non-uniformity of the potential on the fourth electrode (FR part surface potential adjustment electrode) 61b.

Further, in the electrostatic chuck device 201 according to this embodiment, the total number of the third electrode (sample mounting surface adjustment electrode) 51a and the fourth electrode (FR part surface potential adjustment electrode) 61b is one or more.

With this configuration, in the electrostatic chuck device 201 according to this embodiment, the sheath voltage of the portion where the etching rate is high is finely adjusted compared to a case where each of the third electrode (sample mounting surface adjustment electrode) 51a and the fourth electrode (FR part surface potential adjustment electrode) 61b is one, and thus it is possible to reduce the non-uniformity of etching on the sample mounting surface 21*a* and the structure mounting surface 21*b* of the electrostatic chuck part 212.

Further, by adjusting the phase of the RF voltage which is applied to the plurality of third electrodes 51*a* and the plurality of fourth electrodes 61*b*, it is also possible to adjust the direction in addition to the intensity of the sheath voltage.

Further, in the electrostatic chuck device 201 according to this embodiment, the third electrode (sample mounting surface adjustment electrode) 51*a* and the fourth electrode (FR part surface potential adjustment electrode) 61*b* are insulated from each other with an insulating organic material.

With this configuration, in the electrostatic chuck device 201 according to this embodiment, it is possible to suppress an electric discharge from the side surfaces of the third electrode (sample mounting surface adjustment electrode) 51*a* and the fourth electrode (FR part surface potential adjustment electrode) 61*b*.

Modification Example 1 of Second Embodiment

Figure 5:
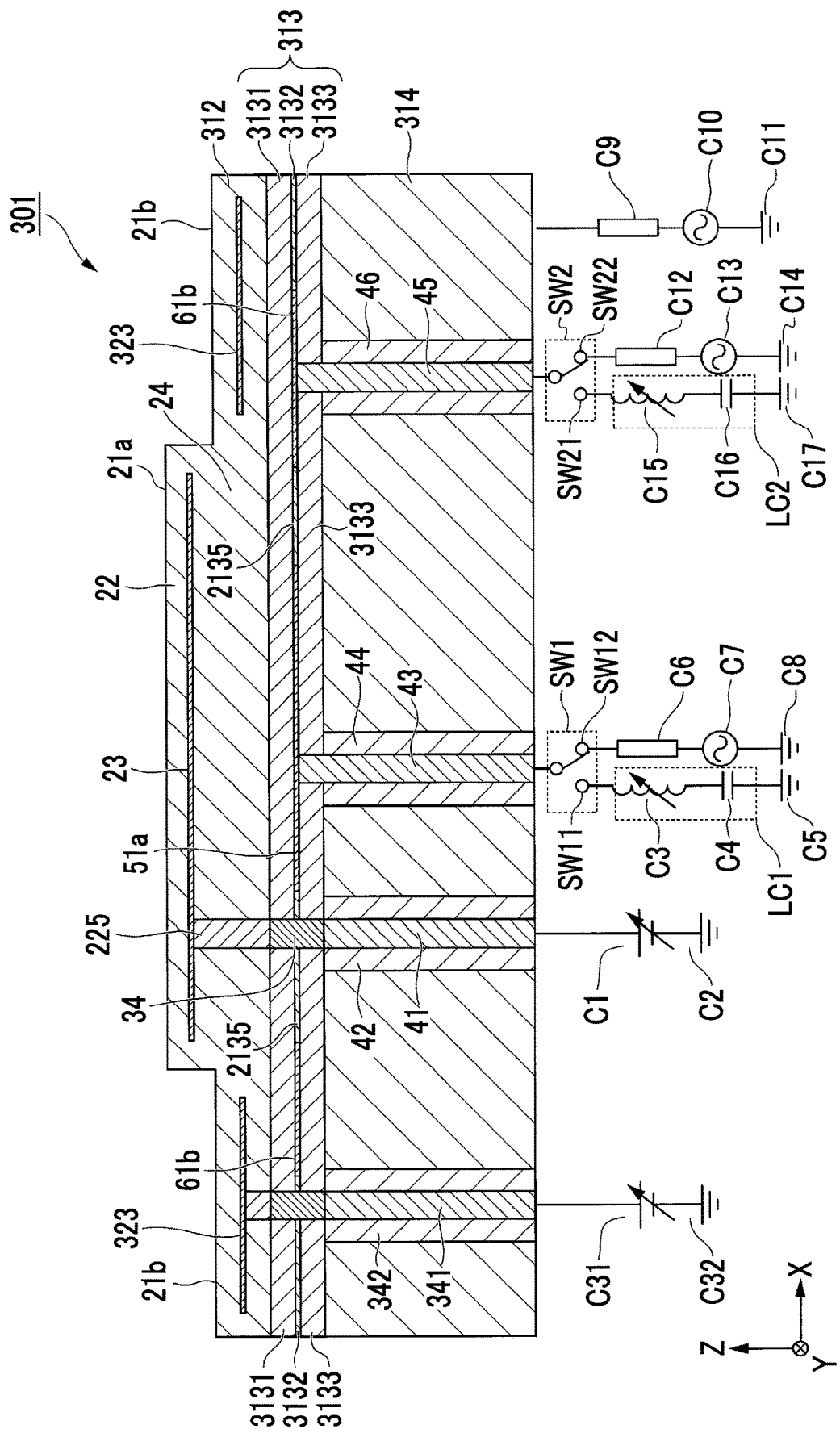
FIG. 5 is a sectional view showing a first modification example of the electrostatic chuck device according to the second embodiment of the present invention.

Here, a case where the electrode for structure electrostatic attraction is provided in the electrostatic chuck part will be described with reference to FIG. 5. FIG. 5 is a sectional view showing a first modification example of the electrostatic chuck device according to this embodiment. An electrostatic chuck device 301 has an electrode for FR electrostatic attraction 323 in the interior of an electrostatic chuck part 312.

The electrode for FR electrostatic attraction 323 is provided in the interior of the electrostatic chuck part 312 at the portion which overlaps the structure mounting surface 21*b* when the electrostatic chuck part 312 is viewed downward from above. The electrode for FR electrostatic attraction 323 is a ring-shaped electrode.

The electrode for FR electrostatic attraction 323 is connected to a variable direct-current power source C31 through an extraction electrode terminal 341. The electrode for FR electrostatic attraction 323 attracts a focus ring (not shown) which is placed on the structure mounting surface 21*b*.

Modification Example 2 of Second Embodiment

Figure 6:
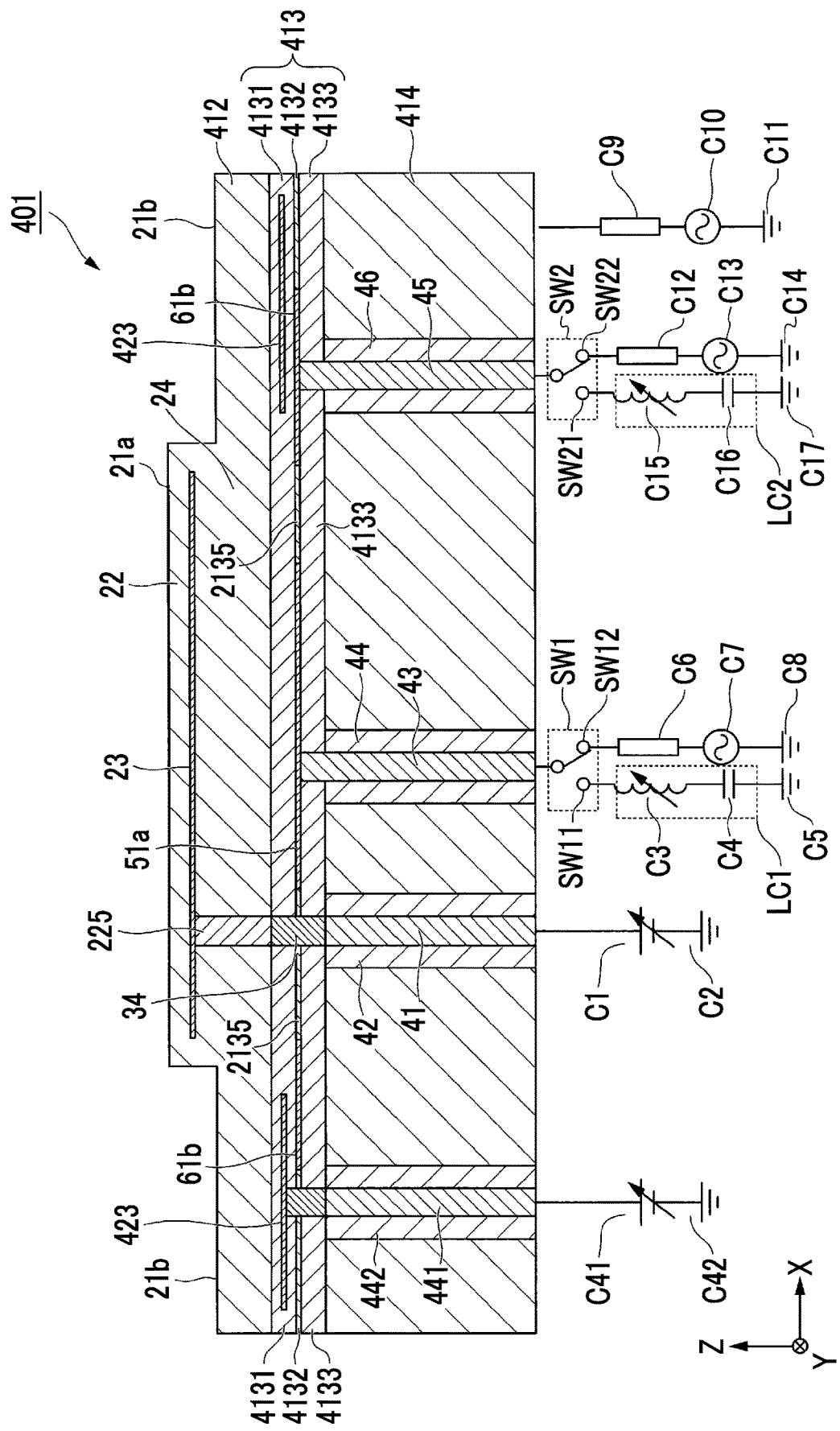
FIG. 6 is a sectional view showing a second modification example of the electrostatic chuck device according to the second embodiment of the present invention.
Figure 7:
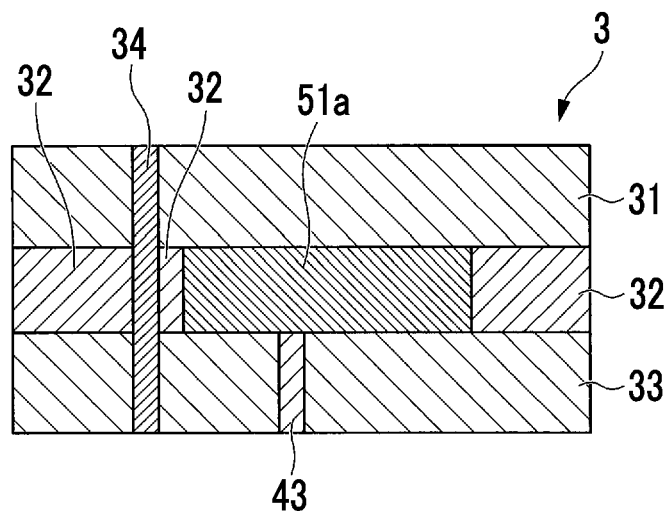
FIG. 7 is an enlarged view of an insulating adhesive layer 3 in FIG. 1.
Figure 8:
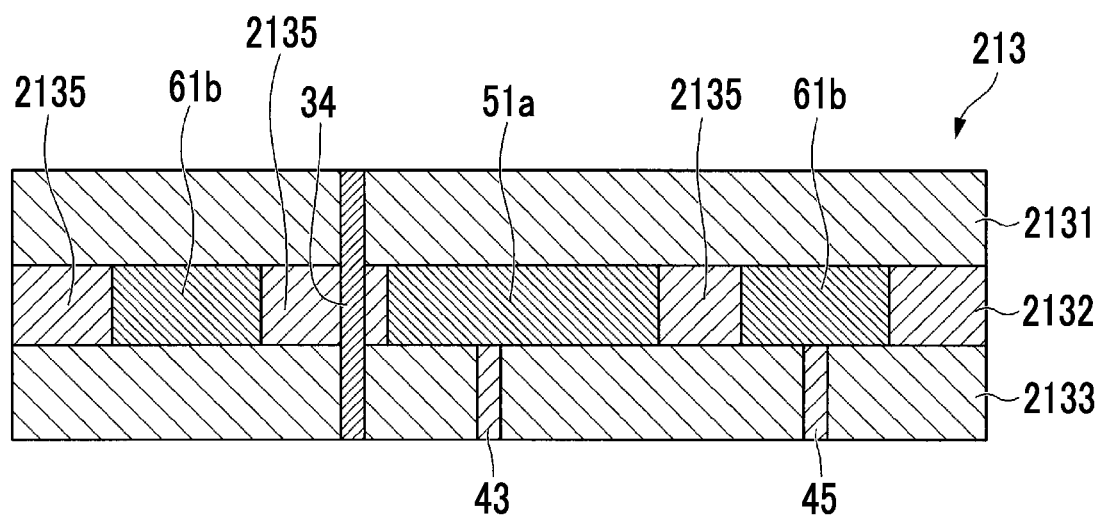
FIG. 8 is an enlarged view of an insulating adhesive layer 213 in FIG. 4.
Figure 9:
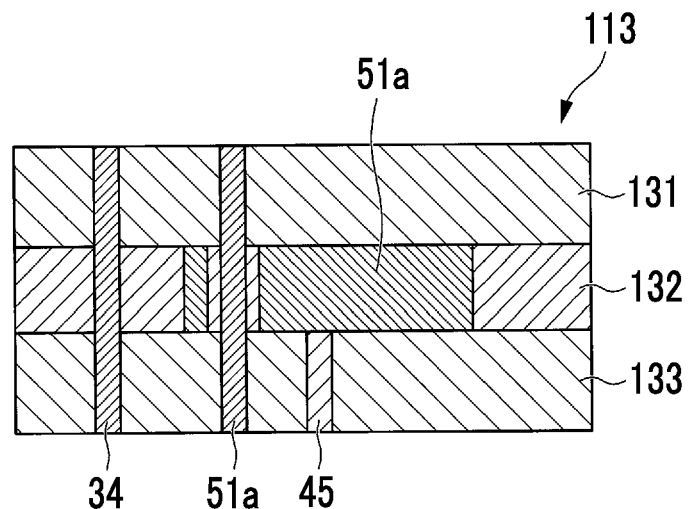
FIG. 9 is an enlarged view of an insulating adhesive layer 113 in FIG. 3.
Figure 10:
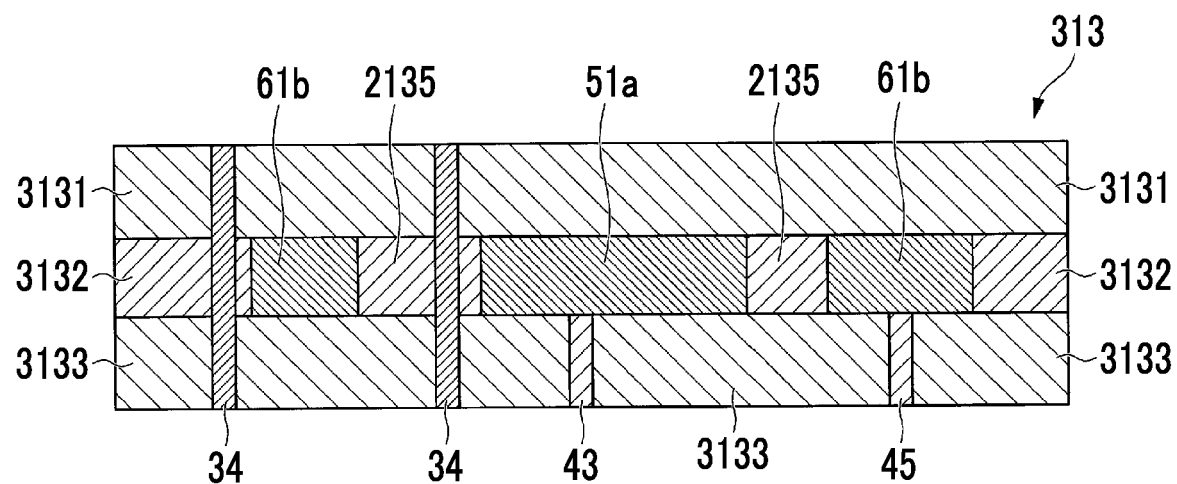
FIG. 10 is an enlarged view of an insulating adhesive layer 313 in FIG. 5.
Figure 11:
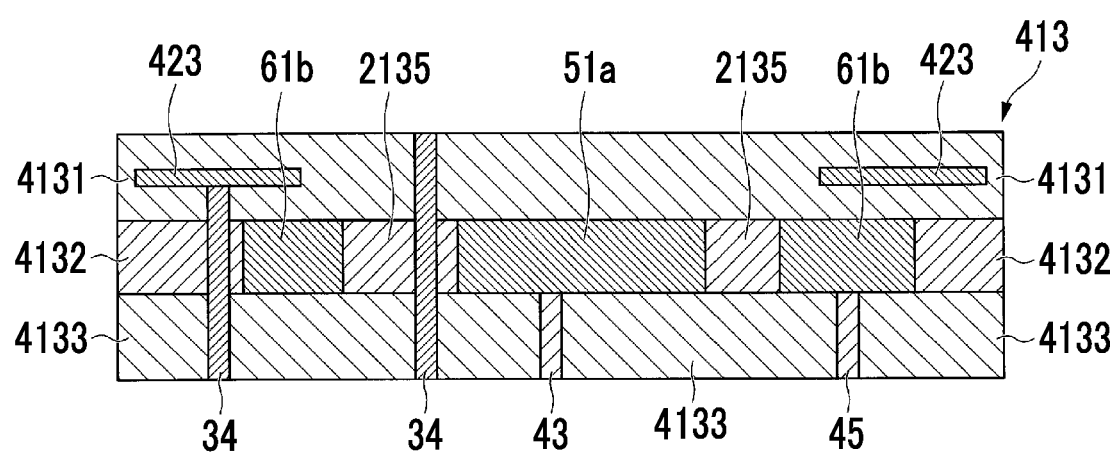
FIG. 11 is an enlarged view of an insulating adhesive layer 413 in FIG. 6.

Here, a case where the electrode for structure electrostatic attraction is provided in the insulating adhesive layer will be described with reference to FIG. 6. FIG. 6 is a sectional view showing a second modification example of the electrostatic chuck device according to this embodiment.

An electrostatic chuck device 401 has an electrode for FR electrostatic attraction 423 in an adhesive layer 413 which bonds an electrostatic chuck part 412 and a cooling base part 414 together.

The electrode for FR electrostatic attraction 423 is provided in the adhesive layer 413 at the portion which overlaps the structure mounting surface 21*b* when the electrostatic chuck part 412 is viewed downward from above. The electrode for FR electrostatic attraction 423 has the portion which overlaps the fourth electrode (FR part surface potential adjustment electrode) 61*b* when the electrostatic chuck part 412 is viewed downward from above. The electrode for FR electrostatic attraction 423 is a ring-shaped electrode.

The electrode for FR electrostatic attraction 423 (FIG. 6) makes the structure of the electrostatic chuck part 412 simpler than in a case of being provided in the interior of the electrostatic chuck part 412 like the electrode for FR electrostatic attraction 323 (FIG. 5), and thus it is possible to easily install the electrostatic chuck part 412 in an electrostatic chuck device known in the related art.

Embodiments of the present invention have been described in detail above with reference to the drawings. However, the specific configurations are not limited to the configurations described above, and various design changes and the like can be made within a scope which does not depart from the gist of the present invention.

REFERENCE SIGNS LIST 1, 101, 201: electrostatic chuck device
2, 212: electrostatic chuck part
3, 213: insulating adhesive layer
31, 131, 2131, 3131, 4131: first insulating adhesive layer
32, 132, 2132, 3132, 4132: second insulating adhesive layer
33, 133, 2133, 3133, 4133: third insulating adhesive layer
2135: fourth insulating adhesive layer
4, 114, 214: cooling base part
21*a*: sample mounting surface
21*b*: structure mounting surface
22: placing plate
23: electrode for wafer electrostatic attraction
123: first electrode for wafer electrostatic attraction
124: second electrode for wafer electrostatic attraction
24: supporting plate
25, 225: electrode pin for wafer electrostatic attraction
34: conductive adhesive layer
41, 141, 341, 441, 43, 143, 45: extraction electrode terminal
42, 142, 342, 442, 44, 144, 46: insulator
51*a*: third electrode for RF electrode or LC adjustment (sample mounting surface adjustment electrode)
61*b*: fourth electrode for RF electrode or LC adjustment (FR part surface potential adjustment electrode)
C1, C31, C41, C101, C103: variable direct-current power source
C2, C32, C42, C102, C104, C5, C8, C11: earth
C3: variable inductor
C4: capacitor
C6, C9, C12: matching box
C7, C10, C13: high-frequency power source
LC1: LC resonance circuit
SW1: switch
SW11: first terminal
SW12: second terminal

The invention claimed is:

1. An electrostatic chuck device comprising:
an electrostatic chuck part having a sample mounting surface on which a sample is mounted and having a first electrode for electrostatic attraction;
a cooling base part placed on a side opposite to the sample mounting surface with respect to the electrostatic chuck part to cool the electrostatic chuck part; and
an insulating adhesive layer comprising an organic insulating material that bonds the electrostatic chuck part and the cooling base part together,
wherein the cooling base part has a function of a second electrode that is an RF electrode,
the electrostatic chuck device further comprises a third electrode, configured to be connected to a high-frequency power source or LC resonance circuit, between the electrostatic chuck part and the cooling base part, the third electrode is surrounded by the organic insulating material on a side surface thereof, the insulating adhesive layer has the third electrode in the interior of the insulating adhesive layer, the third electrode is a metal foil having a thickness of 5 μm to 500 μm, and the third electrode is bonded to the electrostatic chuck part and the cooling base part and insulated from the cooling base part via the insulating adhesive layer.

2. The electrostatic chuck device according to claim 1, wherein the third electrode is provided between the sample mounting surface and the cooling base part.

3. The electrostatic chuck device according to claim 1, wherein the third electrode is made of a nonmagnetic material.

4. The electrostatic chuck device according to claim 1, wherein a fourth electrode for RF electrode or LC adjustment is provided between the electrostatic chuck part and the cooling base part, and the fourth electrode is bonded to the electrostatic chuck part and the cooling base part and insulated from the cooling base part.

5. The electrostatic chuck device according to claim 4, wherein the fourth electrode is surrounded by an organic insulating material.

6. The electrostatic chuck device according to claim 4, further comprises a structure mounting surface on which an annular structure surrounding a periphery of the sample mounting surface is mounted in a recess around the periphery of the sample mounting surface and the recess is recessed from the sample mounting surface, wherein the fourth electrode is provided between the structure mounting surface and the cooling base part.

7. The electrostatic chuck device according to claim 4, wherein the fourth electrode is bonded to the electrostatic chuck part with an organic material.

8. The electrostatic chuck device according to claim 4, wherein the fourth electrode is made of a nonmagnetic material.

9. The electrostatic chuck device according to claim 4, wherein the fourth electrode is a metal foil having a thickness of 5 μm to 500 μm.

10. The electrostatic chuck device according to claim 4, wherein the total number of each of the third electrode and the fourth electrode is one or more.

11. The electrostatic chuck device according to claim 4, wherein the third electrode and the fourth electrode are insulated from each other with an insulating organic material.

12. The electrostatic chuck device according to claim 1, wherein a sheet resistance of the first electrode is larger than $1.0\Omega/\square$ and smaller than $1.0\times10^{10}\Omega/\square$, and a thickness of the first electrode is larger than 0.5 μm and smaller than 50 μm.

13. The electrostatic chuck device according to claim 1, wherein the insulating adhesive layer includes a first, a second and a third insulating adhesive layers.

14. The electrostatic chuck device according to claim 13, wherein the second insulating adhesive layer has the third electrode at an inner peripheral portion of a disk of the insulating adhesive layer.

15. The electrostatic chuck device according to claim 13, wherein the insulating adhesive layer is made of a material having rubber elasticity.

16. The electrostatic chuck device according to claim 13, wherein the insulating adhesive layer is made of silicone resin.

17. The electrostatic chuck device according to claim 1, wherein the third electrode is surrounded by the organic insulating material on all of the side, top or bottom surfaces.

18. The electrostatic chuck device according to claim 13, wherein the first, the second and the third insulating adhesive layers are provided on the top, side and bottom surfaces of the third electrode, respectively.

* * * * *